(12) United States Patent
Chien

(10) Patent No.: US 6,183,101 B1
(45) Date of Patent: Feb. 6, 2001

(54) COVER ARRANGEMENT INCLUDING AN ELECTRO-LUMINESCENT ELEMENT

(76) Inventor: Tseng-Lu Chien, 8F, No. 29, Alley 73, Lin-Shen Road, Shi-Chi Town, Taipei Hseng (TW)

(*) Notice: Under 35 U.S.C. 154(b), the term of this patent shall be extended for 0 days.

(21) Appl. No.: 08/963,269

(22) Filed: Nov. 3, 1997

Related U.S. Application Data

(63) Continuation-in-part of application No. 08/910,202, filed on Aug. 13, 1997, which is a continuation-in-part of application No. 08/383,404, filed on Feb. 3, 1995, now Pat. No. 5,667,394.

(51) Int. Cl.[7] ............................................... F21V 9/16
(52) U.S. Cl. ............................................................ 362/84
(58) Field of Search ................................. 439/86; 362/84, 362/95

(56) References Cited

U.S. PATENT DOCUMENTS 5,662,408 * 9/1997 Marischen ............................... 362/84

* cited by examiner

*Primary Examiner*—Neil Abrams

(57) ABSTRACT

A cover (1) for a wall switch, outlet, or the like includes a groove (4) in which is situated multiple electro-luminescent elements (5,6), the electro-luminescent elements being electrically connected to a power supply by a conductive member (19,20) which extends through an opening (17) between the base of the groove and a rear of the cover and is pressed against the electrodes (13–16) by a pressing member (26), the conductive member engaging adjacent electrodes of at least two of the electro-luminescent elements. The conductive members may include a pair of tubes formed of conductive rubber for receiving stripped ends of the wires (23).

11 Claims, 5 Drawing Sheets

COVER ARRANGEMENT INCLUDING AN ELECTRO-LUMINESCENT ELEMENT

CROSS-REFERENCE TO RELATED APPLICATIONS

This application is a continuation-in-part of U.S. patent application Ser. No. 08/910,202, filed Aug. 13, 1997, which is a continuation-in-part of U.S. patent application Ser. No. 08/383,404, filed Feb. 3, 1995, and now U.S. Pat. No. 5,667,394.

BACKGROUND OF THE INVENTION

1. Field of the Invention

This invention relates to a connector set which permits an electro-luminescent lighting element to be combined with a wall-mounted switch plate, electrical outlet cover, and similar devices such as a coaxial or CATV cable outlet cover plate, an antenna connection cover plate, a timer set housing, or a keyboard of a security system in order to provide nighttime illumination for convenience or decorative purposes.

In general, the types of "covers" with which the present invention is concerned are covers which surround an electrical outlet, switch, or user interface so as to prevent a user of the outlet, switch, or user interface from touching the electrical connections to the outlet, switch, or user interface and also to hide the electrical connections. Such covers are often referred to as cover plates or fascia boards, although the shape may vary from that of a true plate or board.

The key characteristics of the covers in question are that they surround the connector, switch, or user interface, that they have a front and rear side, the front side being visible to a user of the connector, switch, or user interface, and that accessible at the back or rear side of the cover, though not necessarily in the immediate vicinity, are electrical connections that can be used to provide power to the electro-luminescent lighting arrangement of the invention.

Several examples of covers are described below, but it will be appreciated by those skilled in the art that the invention is not to be limited to the types of covers illustrated, so long as the covers have the key characteristics noted above.

2. Discussion of Related Art

Parent U.S. patent application Ser. No. 08/910,202, filed Aug. 13, 1997, which is a continuation-in-part of copending U.S. patent application Ser. No. 08/383,404, filed Feb. 3, 1995, now U.S. Pat. No. 5,667,394 discloses an electro-luminescent night light which uses an especially simple and reliable cover arrangement. The present invention applies the principles disclosed in the parent application, and also in its parent application, to a cover arrangement of the type described above, i.e., one which surrounds a connector, switch, or user interface in order to prevent users of the connector, switch, or electrical interface from viewing or contacting the electrical connections behind the cover, by adapting the connector set described in U.S. patent application Ser. Nos. 08/910,202 and 08/383,404 (now U.S. Pat. No. 5,667,394) to an arrangement in which multiple electro-luminescent elements are situated in a groove on the cover and connected by common conductive members extending through an opening in the rear of the cover.

It has previously been proposed to add electro-luminescent lighting elements to covers of the type described above, but the electro-luminescent elements normally have used a very complicated connection arrangement, generally involving some type of rivet for electrically connecting the electro-luminescent element to conductive wires. Such connections require a large number of components, a significant amount of labor, and are not reliable. In addition, the connections are not well-sealed, and can expose children and others to electrical shock by permitting objects such as sharp nails to come into contact with conductors.

On the other hand, the night light disclosed in parent application Ser. No. 08/910,202 is simple to manufacture and is capable of providing a variety of lighting effects. This is achieved by using resilient non-penetrative connector members sandwiched against electrodes of the electro-luminescent elements, but whereas the night light sandwiches the conductive members between electrodes on the electro-luminescent element and prongs of a standard electrical plug, the present invention permits the electro-luminescent elements to be connected to any type of wires rather than just to prongs of a standard electrical plug, by sandwiching the conductive members between the electrodes and a pressing member, with the conductive members in one preferred embodiment of the invention being in the form of cylinders into which leads are inserted in order to complete the electrical connection. In addition, rather than using a single electro-luminescent element and a single conductive member for each of the electrodes of the electro-luminescent element, as disclosed in the parent application, each conductive member of the present invention is arranged to provide electrical connections to the electrodes of a pair of electro-luminescent elements, the use of multiple electro-luminescent elements rather than a single element saving costs by permitting the switch, outlet, or interface to which the cover is applied to be framed by the electro-luminescent elements using simple shapes and smaller elements.

Like the parent application, the present invention utilizes commercially available or previously proposed types of electro-luminescent lighting elements such as the electro-luminescent panels having discrete phosphor coatings disclosed in U.S. Pat. No. 5,572,817, and in copending U.S. patent application Ser. Nos. 08/729,408 (now U.S. Pat. No. 5,752,337), 08/734,872 (now U.S. Pat. No. 5,833,508), and 08/746,706 (pending), each of which is incorporated by reference herein, as well as the three-dimensional electro-luminescent tube arrangement disclosed in U.S. patent application Ser. No. 08/758,393, which is also incorporated by reference herein. The night lights of the present invention may also be used with the optical effects device disclosed in U.S. patent application Ser. No. 08/841,624 (pending), also incorporated herein by reference, which is a continuation of U.S. patent application Ser. No. 08/489,160 (abandoned).

It is noted that similar arrangements are also disclosed in copending U.S. patent application Ser. No. 08/925,122, filed Sep. 8, 1997, entitled "Electro-Luminescent Night Light Arrangements," the disclosure of which is incorporated by reference herein, including the discussion of U.S. Pat. No. 5,662,408, which discloses a night light including a non-penetrative connector set and electro-luminescent element, but does not utilize conductive members sandwiched between electrodes of the electro-luminescent element and the power supply conductors, as in the parent application, or multiple electro-luminescent elements and connector members of the type described in the present application.

SUMMARY OF THE INVENTION

It is accordingly an objective of the invention to provide an electro-luminescent lighting arrangement for a cover of the type which surrounds a connector, switch, or user interface, the cover having a front side and a rear side, the front side being visible to a user of the connector, switch, or user interface, and with electrical connections that can be used to supply power to the electro-luminescent element being accessible at the back or rear side of the cover, though not necessarily in the immediate vicinity of the cover.

It is a further objective of the invention to provide a cover of the type described above, such as a wall-mounted switch plate, electrical outlet cover, coaxial or CATV cable outlet cover plate, an antenna connection cover plate, a timer set housing, or a keyboard of a security system, which has all of the advantages provided by the inclusion of electro-luminescent lighting elements, including brightness, color choice, and the ability to exhibit a variety of special effects including, in the case of discrete phosphor panels, multi-color and motion effects, and yet which is simple to assemble, low in cost, and decreases the risk of electric shocks or short circuits.

It yet another objective of the invention to provide an improved electro-luminescent lighting arrangement for a cover plate or decorative fascia plate for an electrical outlet, wall switch, or other devices such as security devices, card or chip readers, access control devices, and so forth, having multiple electro-luminescent elements connected together to frame the central opening which permits access to the switch or outlet so as to enable use of low cost, commonly available electro-luminescent elements, and in which adjacent electrodes of the electro-luminescent elements are electrically connected to a power source by common conductive members in order to further reduce costs and simplify assembly.

These objectives are achieved, in accordance with the principles of the invention, by providing a cover on which at least two electro-luminescent elements are mounted, the cover having an opening for resilient conductive members which engage electrodes of the at least two electro-luminescent elements, and the at least two electro-luminescent elements being sealed between the plate and an at least partially transparent cover.

In one exemplary embodiment of the invention, the electro-luminescent elements are U or L shaped, the plate includes grooves in which the electro-luminescent elements and cover are situated, and the conductive members are in the form of conductive rubber cylinders, one side of each of the cylinders engaging an electrode of each of the at least two electro-luminescent elements, and the center of the cylinders receiving wires which supply electric power to the elements, the conductive members being pressed against the electrodes of the electro-luminescent element by a pressing device in order to ensure a good electrical connection.

DETAILED DESCRIPTION OF THE PREFERRED EMBODIMENTS

Figure 1:
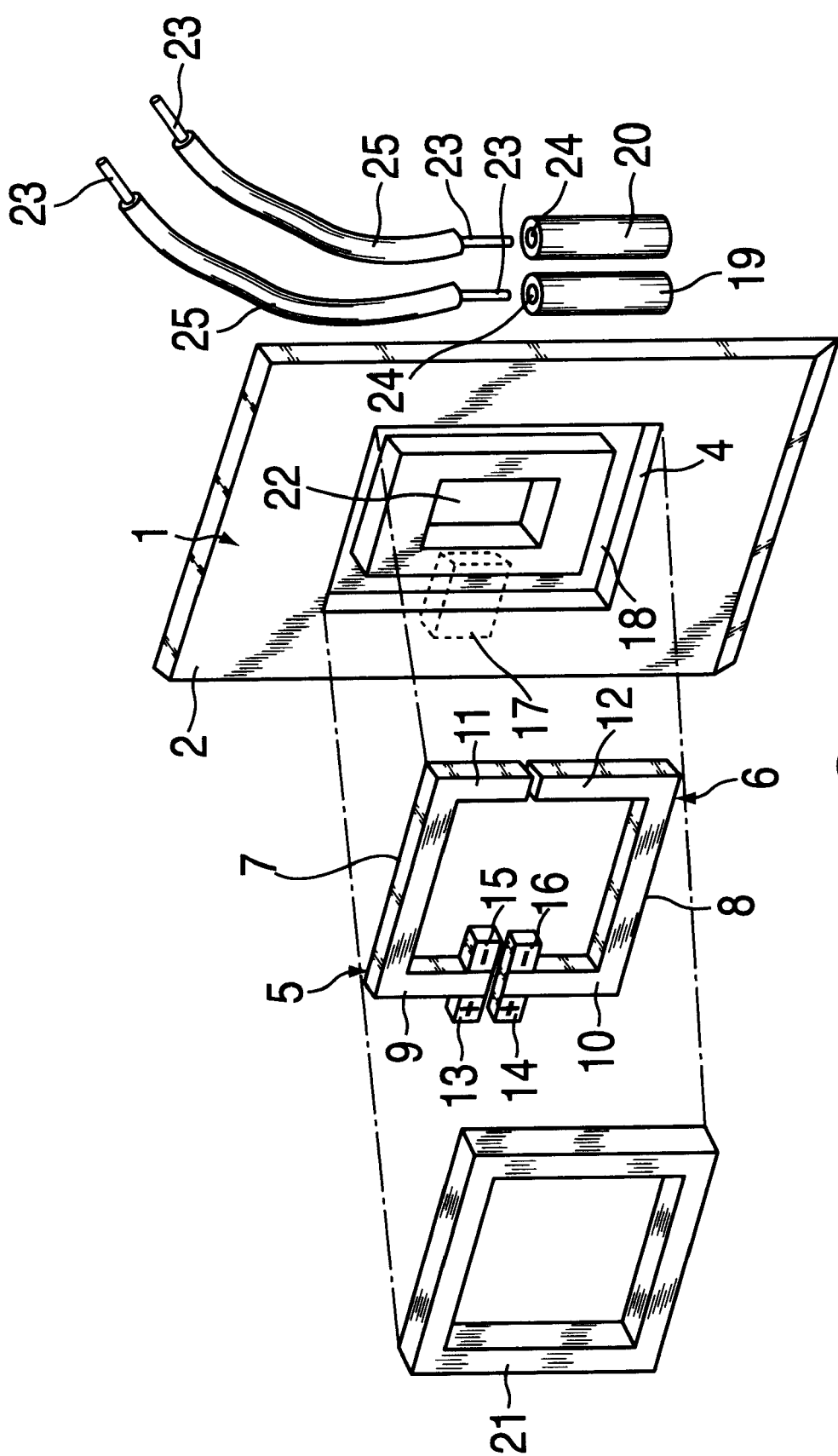
FIG. 1 is an exploded perspective view of the front of a wall switch plate constructed in accordance with the principles of a preferred embodiment of the invention.
Figure 2:
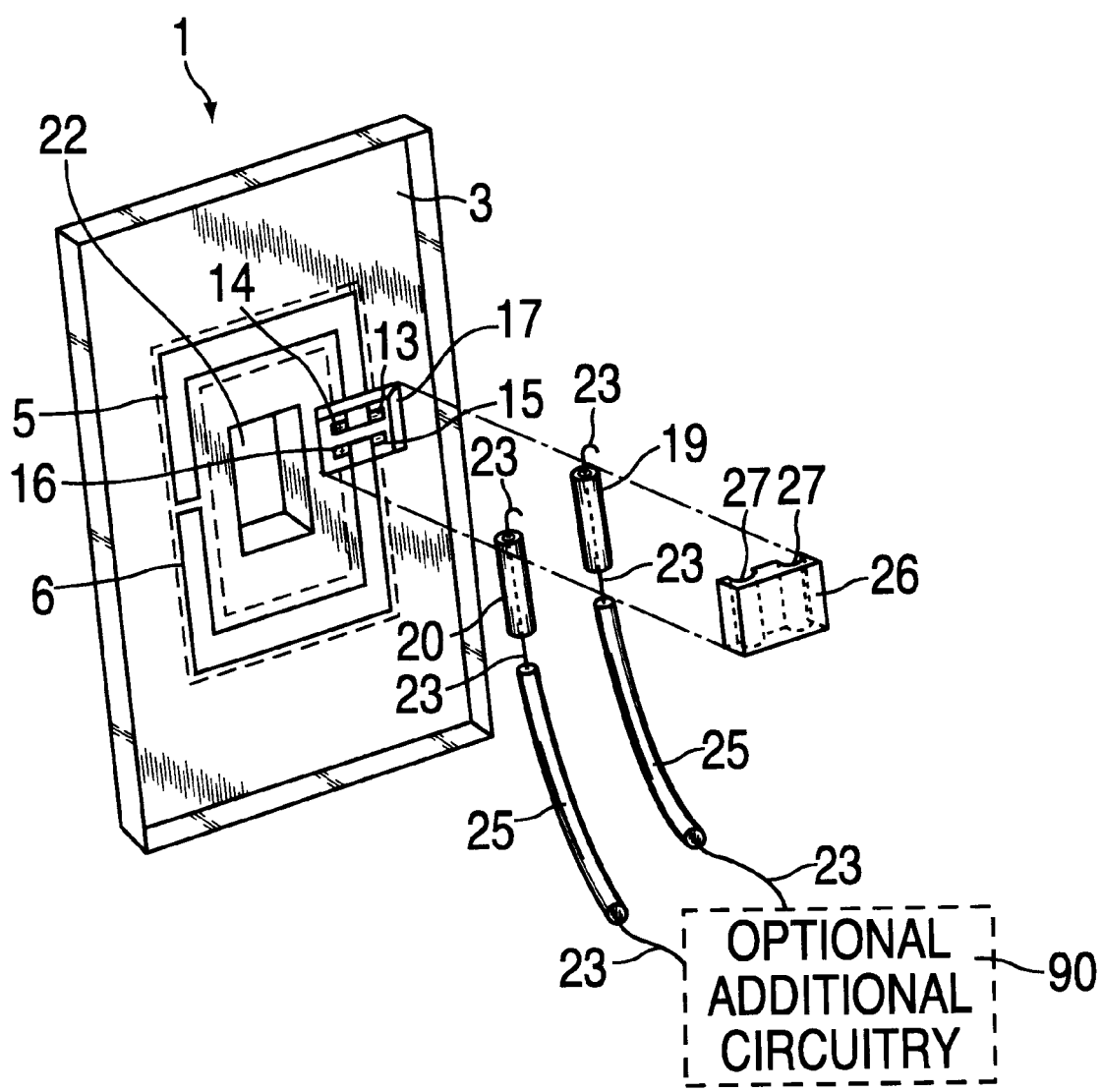
FIG. 2 is an exploded perspective view of the back of the wall switch plate illustrated in FIG. 1.

In the embodiment illustrated in FIGS. 1 and 2, a cover 1 suitable for use as a wall switch plate includes a front surface 2, a back surface 3, and an opening 22 through which extends the handle of a wall switch, with front surface 2 including a groove or recess, 4 for accommodating a pair of electro-luminescent elements 5 and 6. Electro-luminescent elements 5 and 6 each has a U-shape with respective bases 7,8 and arms 9,10,11,12. At the ends of arms 9,10 of the respective electro-luminescent elements are respective positive electrodes 13,14 and negative electrodes 15,16. A through-hole 17 extends between the floor 18 of groove 4 and the back surface 3 of the plate such that when the electro-luminescent elements are positioned in the groove, electrodes 13–16 are accessible from the back through the through-hole 17, and when conductive members 19 and 20 are placed in the through-hole from the rear, each of the conductive members engages a respective pair 13,14 and 15,16 of the electrodes. A cover 21 completes the front of the assembly, and may be shaped to fit within the groove or over it, and furthermore may be in the form of a transparent sheet, partially transparent sheet, PVC sheet, a sheet with stencilling or designs imprinted, drawn, or otherwise present thereon, or any other structure which contains the electro-luminescent element in the groove and permits the electro-luminescent elements to be viewed when power is applied to the electro-luminescent elements.

It will be noted that, in accordance with the principles disclosed in U.S. Pat. No. 5,572,817 and its related applications listed above, instead of two separate electro-luminescent elements, the two electro-luminescent elements may be in the form of separate phosphor coatings on a single sheet. In that case, there could still be multiple electrodes, and the conductive members could still be arranged to engage pairs of electrodes. In addition, the principles of the invention may be extended to numbers of electro-luminescent elements or phosphor coated areas of a single electro-luminescent panel or strip which are greater than two. Also, although not shown in FIG. 2, it is noted that the electro-luminescent elements may overlap at ends 11 and 12 so as to prevent an unattractive gap in the illumination.

Conductive members 19 and 20 are preferably made of a conductive resilient material such as conductive rubber or plastic, or a metal spring material, and in the illustrated embodiment are cylindrical, with one side of the exterior surface of the cylinders being pressed against respective pairs of electrodes so as to establish an electrical connection between wires or leads 23 positioned or inserted into the openings 24 at the centers of the cylinders, the wires having been stripped of insulation 25 and preferably bent to form hooks or otherwise manipulated, as shown in FIG. 2, to secure the wires within the conductive cylinders in a simple manner.

Figure 10:
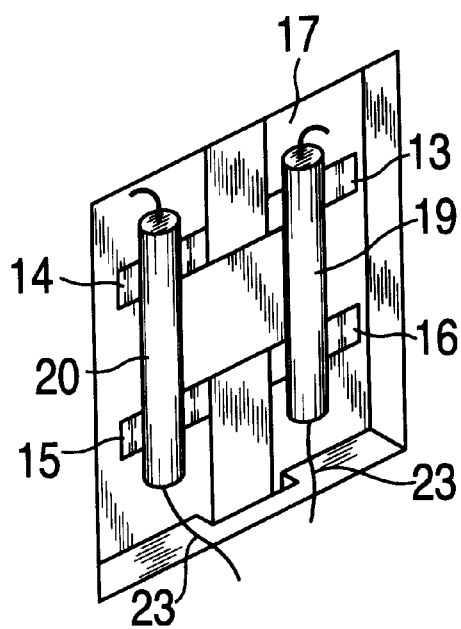
FIG. 10 is an enlarged detail view of the through-hole 17 in FIG. 2.

In order to ensure electrical continuity between the wires or leads 23 and electrodes 13–16 of the electro-luminescent elements 5 and 6, after assembling the wires to the conductive members 19 and 20 and placing the conductive members in through-hole 17 to engage the electrodes, as shown in FIG. 10 a pressing member is installed to apply pressure to the conductive members in order to press the conductive members against the electrodes and at the same time squeeze the wires within openings 24.

Pressing device 26 may be a single member having grooves 27 for accommodating the conductive members 19 and 20, as illustrated in FIG. 2, and which can be interference fit into the through-hole 17, or secured in the through-hole by any other convenient means, in such a manner as to apply the necessary pressure against the conductive members 19 and 20, which as a result are sandwiched between the pressing member and the electrodes of the electro-luminescent element. It is noted that the use of a variety of different types of resilient conductive members is disclosed in U.S. Pat. No. 5,667,394, and that any of the variations disclosed in the prior patent may also be used in connection with the present invention.

As indicated above, the night light unit of the invention can use a variety of different commercially available or previously proposed electro-luminescent elements, including multiple phosphor panels and three-dimensional electro-luminescent elements. In addition, suitable control circuits for the electro-luminescent element are disclosed in numerous prior patents, including but not limited to copending U.S. patent application Ser. No. 08/773,092, incorporated by reference herein, which discloses a circuit for controlling light emission by an electro-luminescent element based on an output of or input to an audio device.

It will also be appreciated by those skilled in the art that the shape of the electro-luminescent elements may be varied as necessary to accommodate the shape of the housing grooves in which the electro-luminescent elements are placed and that the shape of the grooves may be similarly varied. In addition, it is intended that the invention apply to structures which may be referred to by different names, such as indentations or enclosures, but which serve the same positioning and/or sealing function of the illustrated grooves.

Figure 4:
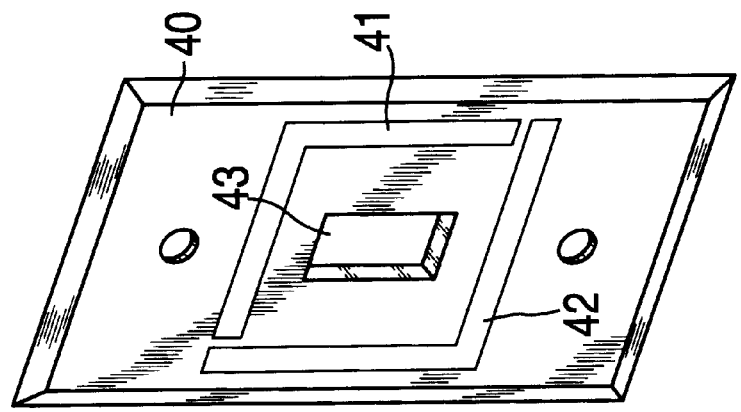
FIG. 4 is a perspective view of a variation of the wall switch cover plate of the preferred embodiment having two L-shaped electro-luminescent elements.
Figure 3:
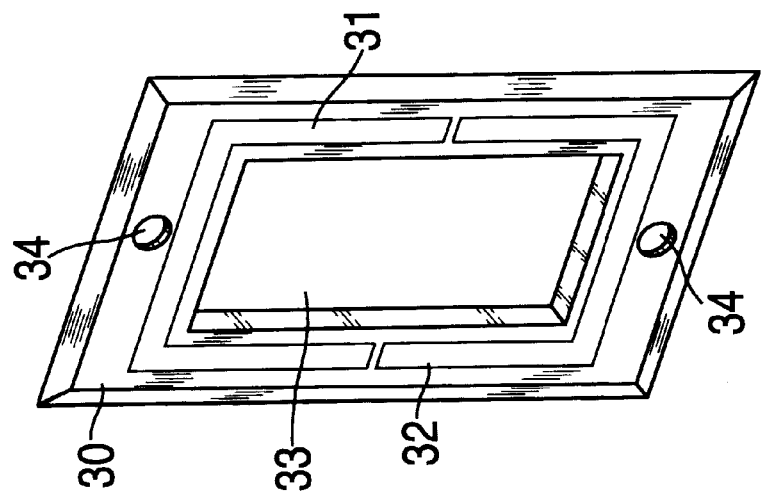
FIG. 3 is a perspective view of an assembled version of the wall switch cover plate illustrated in FIGS. 1 and 2.

The main difference between the cover illustrated in FIGS. 1 and 2 and the cover illustrated in FIG. 3, which is also a switch cover plate 30 with two U-shaped electro-luminescent elements 31 and 32 and an opening 33 for a switch assembly, is that the opening 33 shown in FIG. 3 is larger than the one shown in FIGS. 1 and 2. In addition, further openings 34 through which fastening members may be inserted in order to attach the plate to a switch housing are also illustrated in FIG. 3. Alternatively, as shown in FIG. 4, a switch cover plate 40 may include two L-shaped electro-luminescent elements 41 and 42 in order to frame opening 43.

Figure 5:
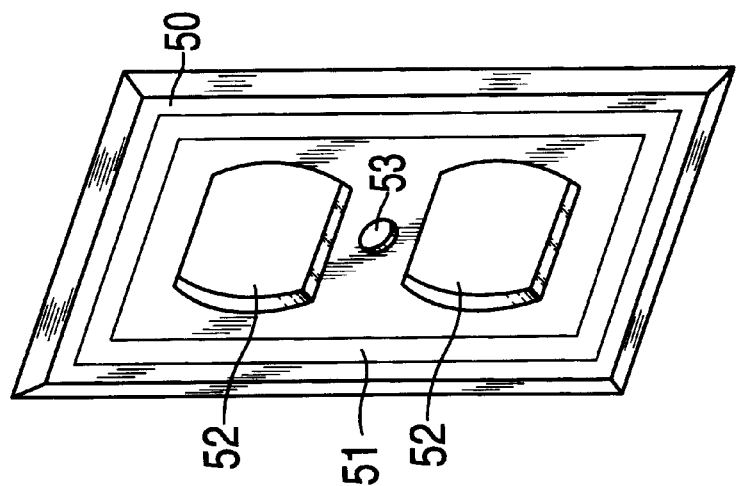
FIG. 5 is a perspective view of an electrical outlet cover plate constructed in accordance with the principles of the invention.

In the variation illustrated in FIG. 5, the cover is an outlet cover 50 which is framed by electro-luminescent elements 51 that can either have an L-shape, a U-shape, or any other shapes capable of forming the illustrated pattern surrounding the socket openings 52 and a fastening means hole 53 arranged to fit a standard outlet.

Figure 8:
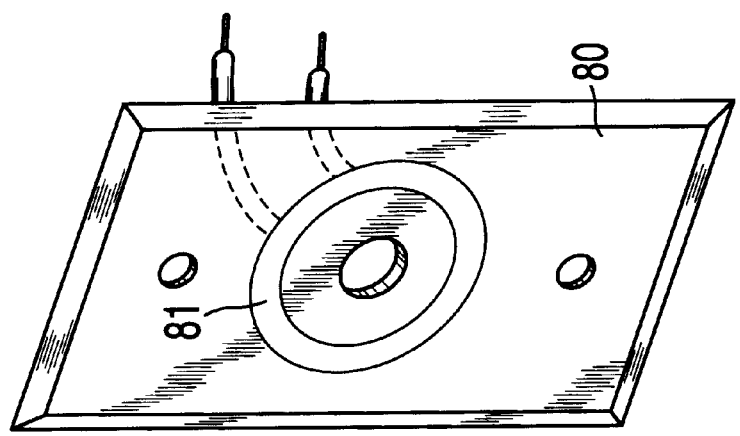
FIG. 8 is a perspective view of a cable outlet cover plate constructed in accordance with the principles of the invention.
Figure 7:
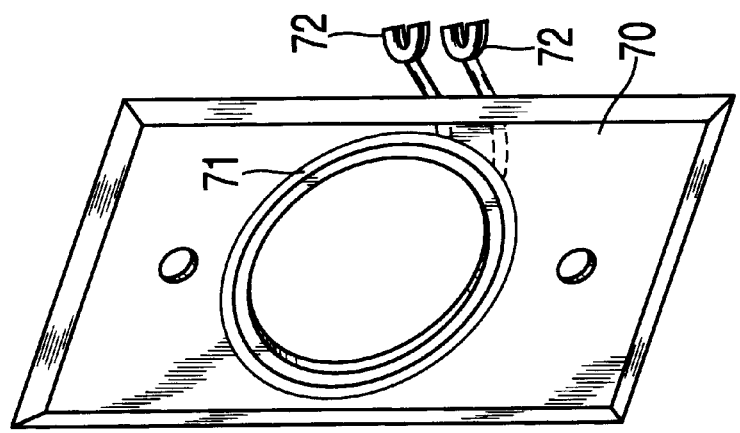
FIG. 7 is a perspective view of a timer cover plate constructed in accordance with the principles of the invention.
Figure 6:
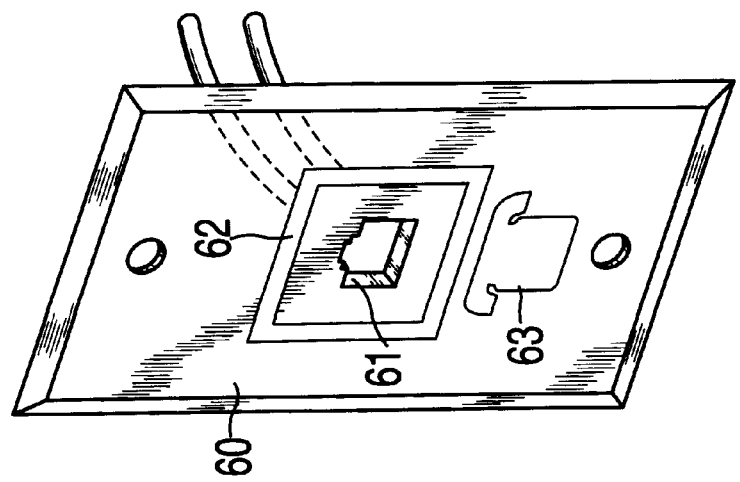
FIG. 6 is a perspective view of a telephone jack cover plate constructed in accordance with the principles of the invention.
Figure 9:
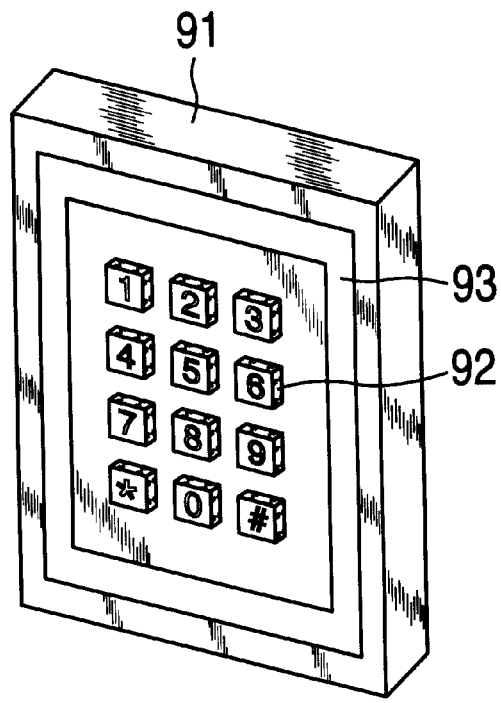
FIG. 9 is a perspective view of a keyboard face plate constructed in accordance with the principles of the invention.

In other possible variations, which are meant to be illustrative and not limiting, the cover plate may be in the form of a telephone jack cover plate 60 having an opening 61 surrounded by an electro-luminescent element 62 having a U-shape, and another electro-luminescent element 63 having an attractive abstract design, as shown in FIG. 6, or the cover may be a timer cover plate 70 having a circular electro-luminescent element arrangement 71 as shown in FIG. 7, for example in the form of two semi-circular electro-luminescent elements. A similar cover plate 80 for a CATV cable wall connector, including a circular electro-luminescent element arrangement 81 is shown in FIG. 8, while FIG. 9 shows a cover plate 91 for a wall-mounted keyboard 92 of the type used to enter security codes, and which includes an electro-luminescent element arrangement 93 similar to the ones shown in FIGS. 1–5. It will be noted that the wires extending from the cover illustrated in FIG. 7 include connectors 72, which illustrates the fact that the connections from the conductive member to the power supply may take a variety fo forms, including the use of connectors, crimp connections, rivets, solder connections, and so forth.

Further examples of covers to which the principles of the invention may be applied are found in copending application Ser. No. 08/925,122, filed Sep. 8, 1997. For example, the cover could be the cover plate of a keypad device for a telephone or intercom rather than a security system, the cover plate of a credit card, telephone card, or integrated card reader, or the fascia board of a palm/fingerprint type identification device. In each of these cases, the inclusion of a night light in the cover will facilitate use of the devices in a dark area.

In each of the above described embodiments, the electro-luminescent elements may either be directly connected by means of wires 23 to the power supply, or indirectly via additional circuitry for controlling the electro-luminescent elements. The additional circuitry is represented by block 90 in FIG. 2, and could be any circuitry known for such purposes, including function interface circuitry, voltage or frequency controlling or converting circuitry, switching circuitry, and so forth. Similar circuitry may be included in any of the embodiments of the invention, or omitted from any of the embodiments. In order to enable use during a power failure, it is also within the scope of the invention to provide a battery backup in addition to or instead of the connection to the main power supply of the device for which the cover is intended to be used.

Having thus described several preferred embodiments of the invention and a number of different variations and modifications of the preferred embodiments, it is anticipated that still further variations and modifications will undoubtedly occur to those skilled in the art upon reading the above description, and it is therefore intended that the invention be interpreted solely in accordance with the appended claims.

I claim:

1. An electro-luminescent light arrangement for a cover having a front side, a rear side, and at least one opening through which an electrical connection is made between at least one electro-luminescent element and a separate power supply, comprising:

an electro-luminescent element situated in a recess in a front surface of the front side of the cover with at least one opening arranged in the recess to allow making an electrical connection between an electrode of the electro-luminescent element and conductive means electrically connected to the power supply for providing an electric pulse from the power supply, the conductive means arranged within the recess at least partially behind the electro-luminescent element;

at least one pressing means for ensuring connection of a conductive member of the conductive means and the electrode of the electro-luminescent element in order to connect the electro-luminescent element to the power supply for illumination; and a light-passable front piece fitted into the recess and having a desired thickness for protecting the electro-luminescent element.

2. An arrangement as claimed in claim 1, wherein at least two electro-luminescent elements are arranged in the recess said two electro-luminescent elements having adjacent electrodes which are contacted by said conductive member.

3. An arrangement as claimed in claim 2, wherein the at least two electro-luminescent elements are U-shaped.

4. An arrangement as claimed in claim 2, wherein the at least two electro-luminescent elements are L-shaped.

5. An arrangement as claimed in claim 1, wherein the conductive member is a resilient conductive member.

6. An arrangement as claimed in claim 5, wherein the conductive member is cylindrically shaped, and the connections to the power supply include a wire extending through the center of the cylinder.

7. An arrangement as claimed in claim 1, wherein the pressing means is a member properly incorporated with an opening for receiving said conductive member.

8. An arrangement as claimed in claim 1, wherein the cover is a cover selected from the group consisting of a wall plate, a switch cover, an electrical outlet cover, a cable outlet cover, a dimmer switch cover, a timer cover, and a keyboard fascia plate.

9. An arrangement as claimed in claim 1, wherein said front piece includes design elements selected from the group consisting of stencils, windows, masking, silkscreening, stickers, and indicia.

10. An arrangement as claimed in claim 1, further comprising additional circuitry connected between the power supply and the conductive member for controlling the electro-luminescent element.

11. An arrangement as claimed in claim 1, wherein the electro-luminescent element includes multiple discrete phosphor coated areas and multiple electrodes corresponding to the multiple discrete phosphor coated areas, and wherein the conductive member engages at least two of said electrodes.

* * * * *